United States Patent
Hablützel et al.

(10) Patent No.: US 11,949,421 B1
(45) Date of Patent: Apr. 2, 2024

(54) TWO-STEP DUTY-CYCLE CORRECTION FOR HIGH-SPEED CLOCKS IN COMMUNICATIONS SYSTEMS

(71) Applicant: Synopsys, Inc., Mountain View, CA (US)

(72) Inventors: Łukasz Hablützel, Gdańsk (PL); Krzysztof Woronowicz, Gdańsk (PL)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/976,720

(22) Filed: Oct. 28, 2022

Related U.S. Application Data

(60) Provisional application No. 63/273,133, filed on Oct. 28, 2021.

(51) Int. Cl.
  *H03K 5/156* (2006.01)
  *H03L 7/081* (2006.01)

(52) U.S. Cl.
  CPC ......... *H03K 5/1565* (2013.01); *H03L 7/0814* (2013.01)

(58) Field of Classification Search
  None
  See application file for complete search history.

(56) References Cited

U.S. PATENT DOCUMENTS

| | | | | |
|---|---|---|---|---|
| 7,915,939 B2* | 3/2011 | Jang | ..... | H03K 5/1565 327/158 |
| 7,990,194 B2* | 8/2011 | Shim | ..... | G11C 7/222 327/158 |
| 8,040,169 B2* | 10/2011 | Chung | ..... | H03L 7/087 327/158 |
| 8,390,351 B2* | 3/2013 | Choi | ..... | G11C 7/1072 327/158 |
| 10,727,826 B2* | 7/2020 | Choi | ..... | G11C 11/4093 |
| 2016/0156342 A1* | 6/2016 | Yun | ..... | H03L 7/085 327/158 |

* cited by examiner

*Primary Examiner* — Cassandra F Cox
(74) *Attorney, Agent, or Firm* — Haynes Beffel & Wolfeld LLP; Andrew L. Dunlap

(57) ABSTRACT

A method and system for performing duty-cycle correction (DCC) on a clock signal is provided. The method provides a two-step duty cycle correction. The method can include performing a main DCC of a single-ended clock signal, to generate a duty cycle adjusted single-ended clock signal, wherein a duty cycle of the single-ended clock signal is corrected according to a received duty-cycle continuous control signal and converting the duty cycle adjusted single-ended clock signal to differential clock signals. The method can further include performing a trim DCC by correcting a duty cycle of the differential clock signals according to a duty-cycle trim control signal received and generated in dependence upon duty cycles detected from differential output clock signals to provide error-corrected differential clock signals.

20 Claims, 6 Drawing Sheets

TWO-STEP DUTY-CYCLE CORRECTION FOR HIGH-SPEED CLOCKS IN COMMUNICATIONS SYSTEMS

RELATED APPLICATION

This application claims priority to U.S. Provisional Application No. 63/273,133, filed on Oct. 28, 2021 and titled "TWO-STEP DUTY-CYCLE CORRECTION FOR HIGH-SPEED CLOCKS IN COMMUNICATIONS SYSTEMS", the contents of which are incorporated by reference herein.

TECHNICAL FIELD

The present disclosure relates to correcting a duty-cycle for high-speed clocks in communications systems circuits. More specifically, the present disclosure relates to correcting the duty-cycle in a circuit with a distributed clock signal.

BACKGROUND

Clock signals are distributed in high-speed communications systems, such as serializer/deserializer (SERDES) communication systems, for various components to remain synchronized. High-speed communication systems use clock signals that have a high clock frequency and rigid requirements regarding the duty-cycles of the clock signals. It is important to have accurate and consistent duty-cycles in the clock signals throughout the circuit for the communications systems to work properly.

SUMMARY

A method and a circuit for performing duty-cycle correction (DCC) for clock signals is provided. The method provides a two-step duty cycle correction. The method can include performing a main duty-cycle correction (DCC) of a single-ended clock signal, to generate a duty cycle adjusted-single-ended clock signal, wherein a duty cycle of the single-ended clock signal is corrected according to a received duty-cycle continuous control signal. The method can further include converting the duty cycle adjusted single-ended clock signal to differential clock signals and can include performing a trim DCC by correcting a duty cycle of the differential clock signals according to a duty-cycle trim control signal received and generated in dependence upon duty cycles detected from differential output clock signals to provide error-corrected differential clock signals.

In an embodiment, the duty-cycle continuous control signal can be generated in dependence upon the duty cycles detected from the differential output clock signals.

In a further embodiment, after the performing of the trim DCC, de-skewing can be performed on the error-corrected differential clock signals to remove skew between the error-corrected differential clock signals.

In another embodiment, the trim DCC adds a phase shift to the duty cycles of the differential clock signals in order to calibrate the duty cycle of the differential output clock signals to substantially 50% plus or minus 1%.

According to an embodiment, the performing of the trim DCC can correct the differential clock signals by applying a same fixed amount of common duty-cycle correction to both the differential clock signals.

In a further embodiment, wherein the amount of main duty-cycle correction applied to the single-ended clock signal is determined in a calibration process, and wherein the fixed amount of common duty-cycle correction applied to both of the differential clock signals can be determined in the calibration process.

According to another embodiment, the differential output clock signals can be used as a system clock and wherein, during the calibration process, and the method can further include detecting duty cycles of the differential output clock signals, determining the fixed amount of common duty-cycle correction to be applied to the differential clock signals in dependence upon the detected duty cycles of the differential output clock signals, and generating the duty-cycle trim control signal according to the determined fixed amount.

In an embodiment, the differential output clock signal can be approximately a 50% duty cycle.

According to a further embodiment, during the calibration process, the method can further include determining an amount of duty-cycle adjustment to be continuously applied to the single-ended clock signal in dependence upon detected duty cycles of the differential output clock signals, and generating the duty-cycle continuous control signal in dependence upon the determined amount of duty-cycle adjustment to be continuously applied to the single-ended clock signal. And likewise during the calibration process, the method can further include determining an amount of duty cycle trim control signal adjustment to be applied to the differential clock signals in dependence upon detected duty cycles of the differential output clock signals during the calibration, and generating the duty cycle trim control signal in dependence upon the determined amount of duty-cycle trim adjustment during the calibration to be applied as a fixed amount while the continuously applied amount of duty-cycle adjustment applied to the single-ended clock signal is varied.

In another embodiment, the differential clock signals can have an equal duty cycle.

In an embodiment, one of the differential clock signals is a positive signal and another of the differential clock signals is a negative signal.

In a further embodiment, one of the differential clock output signals is a positive signal and another of the differential clock signals is a negative signal.

In another embodiment, the trim DCC can be stored in memory, and the method can further include applying further duty cycle corrections during a correction loop, wherein the further DCCs apply the trim DCC stored in memory instead of using the duty-cycle trim control signal to set the trim DCC.

In an embodiment a system is provided. The system can include a signal generator providing an input signal, a main duty cycle corrector configured to perform a main duty cycle correction (DCC) of the input signal to generate a duty cycle adjusted signal, wherein a duty cycle of the input signal is corrected according to a received duty-cycle continuous control signal, a converter configured to convert the duty cycle adjusted signal to differential signals, and a trim duty cycle correction device configured to perform a trim DCC by correcting a duty cycle of the differential signals according to a duty-cycle trim control signal received from and generated by a duty cycle detection control device in dependence upon duty cycles detected from differential output signals to provide error-corrected differential signals.

In a further embodiment the system can further include a de-skewing device configured to receive the error-corrected differential signals and to de-skew the error-corrected differential signals to remove skew between the error-corrected differential signals.

In another embodiment, the system can further include a distribution network for receiving an output from the signal generator, the distribution network including clock lanes distributed from a clock signal source, wherein one of the clock lanes of the distribution network provides the single-ended clock signal provided by the signal generator to the main duty cycle corrector.

In an embodiment, the system can include output clock driver blocks, each output clock driver block provided at an end of one of the clock lanes, wherein each of the output clock driver blocks includes the main duty cycle corrector, the converter, the trim duty cycle corrector, and the duty cycle detector.

In a further embodiment, a non-transitory computer readable medium comprising stored instructions is provided. The instructions, when executed by a processor, can cause the processor to perform a main duty cycle correction (DCC) of a single-ended clock signal, to generate a duty cycle adjusted single-ended clock signal, wherein a duty cycle of the single-ended clock signal is corrected according to a received duty-cycle continuous control signal, convert the duty cycle adjusted single-ended clock signal to differential clock signals, and perform a trim DCC by correcting a duty cycle of the differential clock signals according to a duty-cycle trim control signal received and generated in dependence upon duty cycles detected from differential output clock signals to provide error-corrected differential clock signals.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to correcting a duty-cycle for signals (e.g., high-speed clock signals) in systems, such as communications systems.

Signals, such as clock signals, can be distributed throughout high-speed communications system circuits and the clock signals must remain accurately synchronized in order for the circuitry to function properly. High-speed communication systems use clock signals that have a high clock frequency and also have rigid requirements regarding the duty-cycles of the clock signals (e.g., clock duty-cycle requirements can be approximately 50% duty cycle with ±1% margin). It is important to have accurate and consistent duty-cycles in the clock signals throughout the circuit for the communications systems to function properly. Defects in the circuit may go undetected in a defect analysis if the inaccurate clock signal causes output errors that would mask or cover up a defect otherwise detectable.

Clock synchronization errors can more likely occur in a communication system circuit where a single-ended clock signal is converted to differential clock signals (also referred to as a differential clock signal, which includes two signals, such as a positive signal and a negative signal). Embodiments of the present disclosure are implemented in a circuit with a single-ended clock signal distributed throughout the circuit into separate clock lanes with a converter at the end of the clock lanes converting the single-ended clock to a differential clock output. The differential converter output provides the differential clock signal over two wires with one wire carrying a non-inverted signal and another wire carrying inverted signal. The conversion at the end of the single-ended clock lane reduces energy consumption since only one clock signal needs to be distributed and the differential clock signal can be generated from the single clock signal. However, this conversion presents a need for duty-cycle correction by a duty-cycle corrector (DCC) at locations where the differential clock signal is generated from the conversion of the single-ended clock signal.

Figure 1:
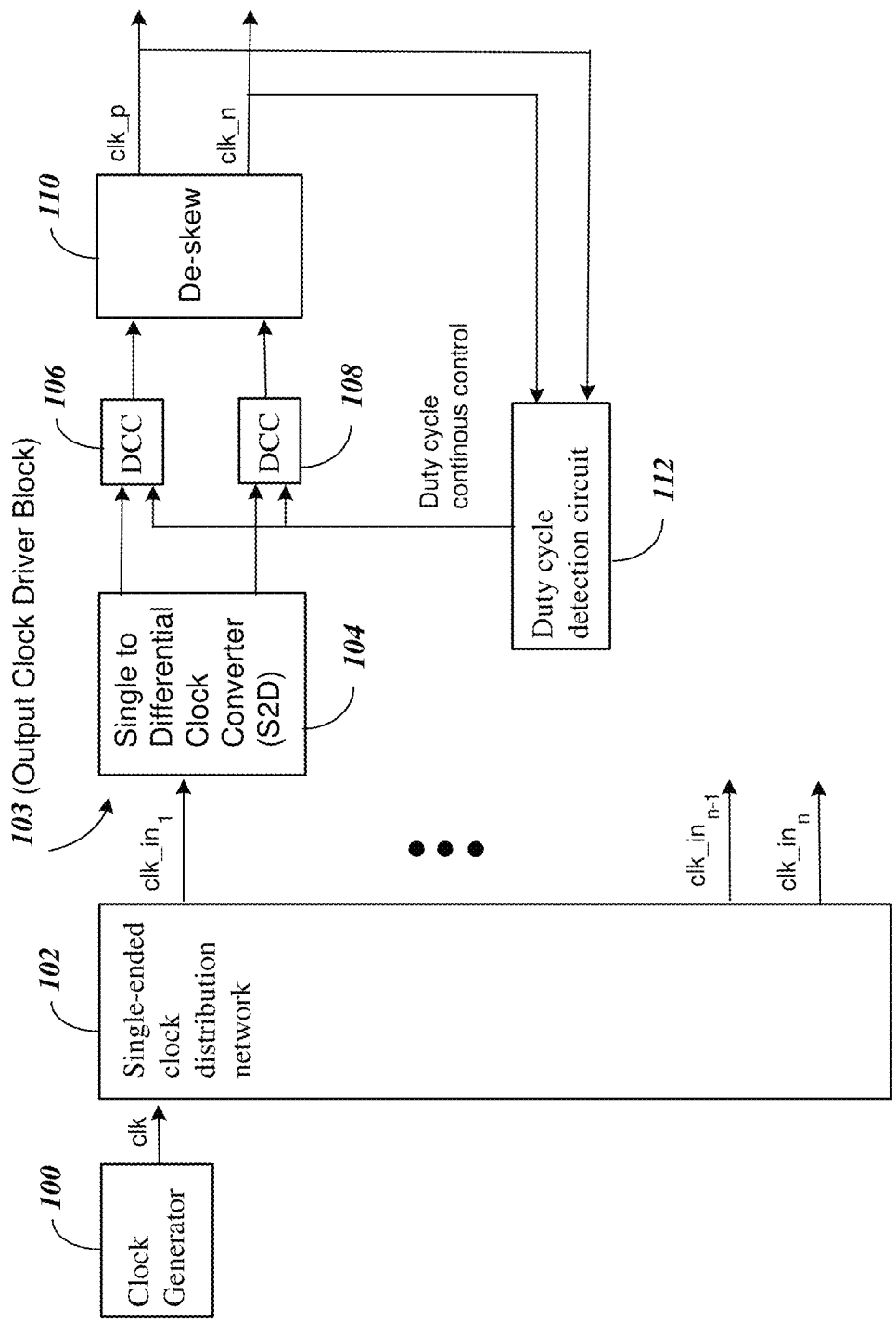
FIG. 1 illustrates a solution for performing duty-cycle correction on clock signals.

FIG. 1 illustrates system (e.g., a circuit) for performing duty-cycle correction in clock signals in accordance with embodiments of the present disclosure. Specifically, FIG. 1 shows an embodiment of various components that are used to convert a single-ended clock signal to a differential clock signal and provide duty-cycle correction. The components first include a clock generator 100 that generates a single-ended clock (clk) signal. The clk signal is then distributed in a single-ended clock distribution network 102 that generates multiple clock-in (clk_in) signals, $clk\_in_1$-$clk\_in_n$. from the clock (clk) signal with each of the clk_in signals provided on a separate lane. In FIG. 1, the $clk\_in_{1-n}$ signals are provided from each lane to an output clock driver block, with the output clock driver block 103 for the clk_in1 signal shown. The output clock driver block 103 includes differential clock converter circuitry (i.e., a single to differential clock converter (S2d) 104) to provide differential output clock signals) as well as the clock duty cycle signal correction circuitry in accordance with embodiments of the present disclosure.

As indicated, one output clock driver block 103 receiving the clk_in1 signal is shown in FIG. 1, and its contents are described. First the output clock driver block 103 includes a single to differential (S2d) clock converter 104 receiving the $clk\_in_1$ signal. The S2d clock converter 104 converts the clock-in (clk_in) into a differential clock signal that includes a non-inverted positive signal and a corresponding inverted negative signal (i.e., two differential clock signals, which can also be referred to as a differential clock signal). The two differential output signals of the S2d clock converter 104 are provided to duty-cycle correctors (DCCs) 106 and 108. The first DCC 106 performs duty-cycle correction on a first signal of the differential clock signal to output a first (positive) duty-cycle corrected clock signal. The second DCC 108 performs duty-cycle correction on a second signal of the differential clock signal to output a second (negative) duty-cycle corrected clock signal. A de-skew device 110 (e.g., a de-skew circuit) receives the duty-cycle corrected differential output signals from DCCs 106 and 108 and functions to provide the corrected de-skewed signals between the first duty-cycle corrected clock signal and the second duty-cycle de-skewed clock signal as a differential output signal including a first (positive) output signal (clk_p) and a corresponding second (negative) output signal (clk_n). A duty cycle detector 112 (e.g., a duty cycle detection device or circuit) further receives the clk_p and clk_n outputs from the de-skew device 110 and uses the signals to generate a duty-cycle continuous control signal that is provided to the DCCs 106 and 108. Based on the duty cycle continuous control signal provided from the duty cycle detector 112, synchronization adjustments can be implemented by the DCCs 106 and 108 using phase shifting, timing adjustment, duty cycle adjustment, amplitude adjustment, domain changing, etc.

With the single step duty cycle correction process applied in FIG. 1, clock errors due to various variations (e.g., Monte Carlo) and single-to-differential (s2d) circuit non-ideality are corrected. To perform the correction one of the first and second duty-cycle corrected signals output from the DCCs 106 and 108 (e.g., the positive signal of these two signals) can be delayed compared to the other of the first and second duty-cycle corrected signals output from the DCCs 106 and 108 (e.g., the negative signal of these two signals). The de-skew device 110 can alternatively phase shift either of the first and second duty-cycle corrected signals to account for the delay, so that the rising edge of one of the first and second duty-cycle corrected signals is aligned with the falling edge of the other of the first and second duty-cycle corrected signals.

As briefly described above, the duty cycle detector 112 observes the duty cycles of the first and second output signals (clk_p and clk_n) and provides the duty-cycle continuous control signal to the DCCs 106 and 108, such that the DCCs 106 and 108 can adjust/correct the duty cycle of their respective outputs by a certain amount (e.g., by a certain percentage, a certain amount of time, etc.). The duty-cycle continuous control signal from duty cycle detector 112 can have specific voltages, currents, etc. that allow for the DCCs 106 and 108 to apply the desired amount of duty-cycle correction. The duty-cycle continuous control signal is continuously provided to the DCCs 106 and 108 based on the constantly monitored duty cycles of the first and second output signals (clk_p and clk_n).

Figure 2:
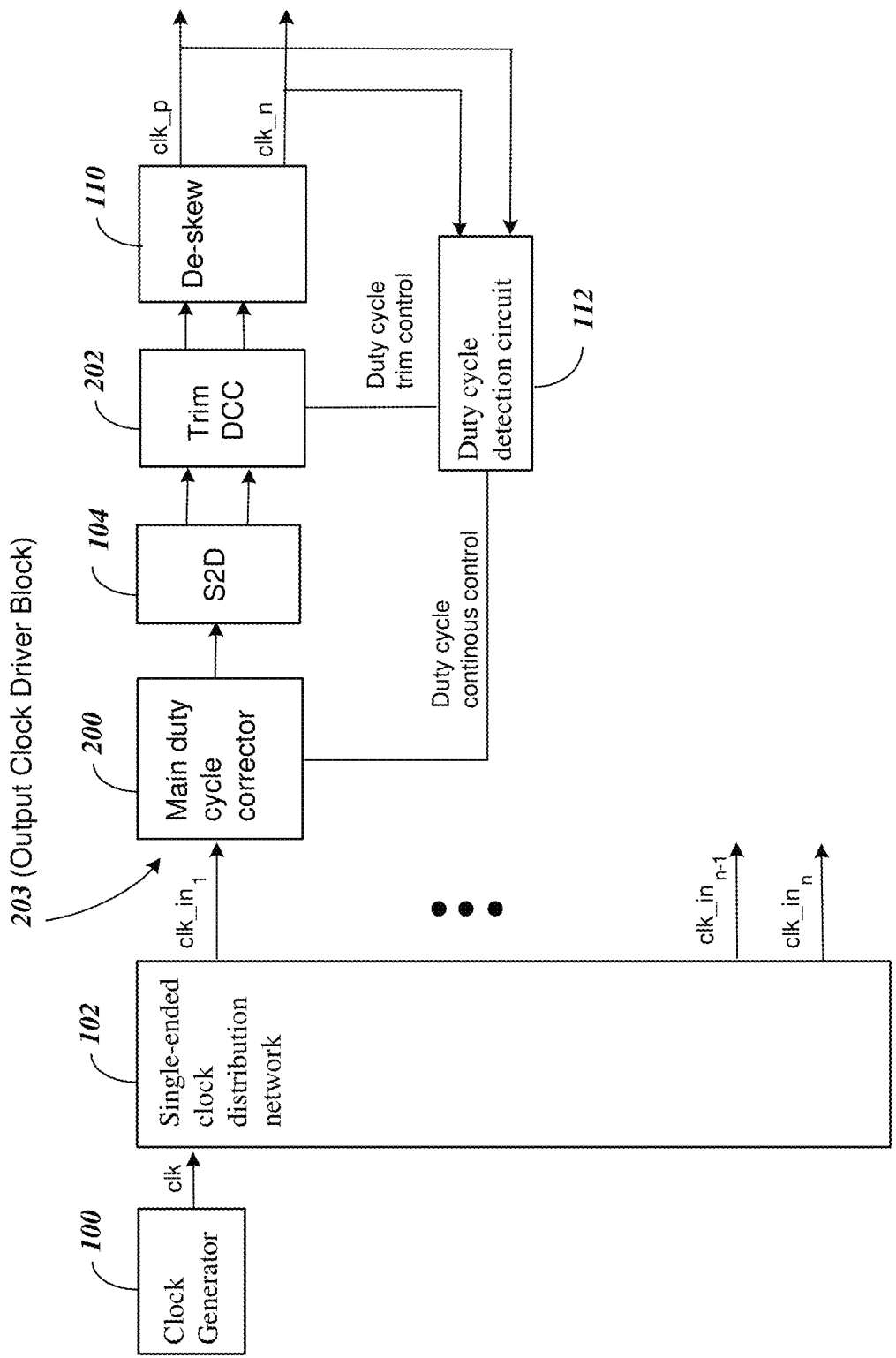
FIG. 2 further illustrates a solution for performing duty-cycle correction on clock signals with duty-cycle correction also applied in the single ended clock path prior to creating differential clock signals.

The solution of the embodiment shown and described with respect to FIG. 1 is a one-step duty correction process. This solution may not be very energy efficient because two complex DCCs are performed by the DCCs 106 and 108, so as to correct the differential clock signal output from the single to differential clock converter 104. Therefore, another embodiment for performing duty-cycle correction is described herein with respect to FIG. 2 that increases duty cycle correction accuracy. FIG. 2 illustrates components that perform a two-step duty-cycle correction, as opposed to the one step duty-cycle correction approach of FIG. 1.

Specifically, FIG. 2 illustrates embodiments of a further solution for performing a two-step duty-cycle correction on a clock signal. The components of FIG. 2 include many of the components of FIG. 1, and components carried over from FIG. 1 to FIG. 2 are similarly numbered. The newly added components in FIG. 2 to accomplish a two-step clock duty-cycle correction are included in each of the output clock driver blocks such as output clock driver block 203 shown in FIG. 2 that has been changed from the output clock driver block 103 of FIG. 1 to accomplish two step correction. The output clock driver block 203 includes a main duty cycle corrector 200 used for a main DCC and a trim DCC 202 for performing a trim DCC. Note for reference that the "main" DCC in some cases is referred to as the "first" DCC and the "trim" DCC is referred to as the "second" DCC.

To begin, the system of FIG. 2 includes a clock generator 100 that generates a clock (clk) signal. The clk signal is then distributed in a single-ended clock distribution network 102 that generates multiple clock-in (clk_in) signals, $clk\_in_1$-$clk\_in_n$, from the clock (clk) signal with each of the clk_in signals provided on a separate lane. The $clk\_in_{1-n}$ signals are provided from each lane to the output clock driver blocks such as 203 shown in FIG. 2.

In FIG. 2, the output clock driver block 203 first includes a main duty cycle corrector (DCC) 200 (e.g., a main DCC circuit) that performs a first "main" DCC step of the two-step duty cycle correction. The main DCC 200 is included in the single-ended clock signal path before the single to differential (S2d) clock converter 104. The main DCC 200 converts an input signal (e.g., a clock-in signal, such as the $clk\_in_1$ signal) into a duty cycle adjusted single-ended clock signal. The S2d clock converter 104 converts the duty cycle adjusted single-ended clock signal into differential clock signals (also referred to as a differential clock signal that actually includes two signals) that include a non-inverted positive signal and a corresponding inverted negative signal. The two differential clock signals output from the S2d clock converter 104 are provided to a trim DCC 202 (e.g., a trim DCC circuit) that provides the second "trim" DCC step of the two-step duty cycle correction. The trim DCC 202 replaces the DCCs 106 and 108 of FIG. 1, but can function in the same manner. The trim DCC 202 performs additional duty cycle correction and outputs error-corrected differential clock signals. The error-corrected differential output signals can be provided to the de-skew device 110 which provides de-skewed differential output clock signals clk_p and clk_n. The differential output clock signals are fed back to the duty cycle detector 112, which unlike in FIG. 1, generates and provides two duty cycle correction control signals. Specifically, the duty cycle detector 112 provides a duty-cycle continuous control signal to the main DCC 200, and further provides a duty-cycle trim control signal to the trim DCC 202.

The trim DCC 202 is different from the main DCC 200, in that it is calibrated once during, for example, a duty-cycle calibration phase. In other words, the trim DCC 202 can be calibrated once, or just once, to perform a certain amount of duty-cycle correction (e.g., 0.5% correction) to all subsequently received signals so that the same duty-cycle correction (e.g., 0.5% correction) is always applied to both first and second signals of the differential clock signals received from the s2d 104. This allows the trim DCC 202 to be more efficient than the main duty cycle corrector 200.

Due to various variations (e.g., Monte Carlo) and single-to-differential (s2d) circuit non-ideality, one of the signals of the error-corrected differential clock signals output from the trim DCC 202 can be delayed compared to the other signal of the error-corrected differential clock signals output from the trim DCC 202. The de-skew device 110 can shift either signal of the error-corrected differential clock signals to account for the delay, so that the rising edge of one signal of the error-corrected differential clock signals is aligned with the falling edge of the other signal of the error-corrected differential clock signal.

The duty cycle detector 112 observes the duty cycles of first and second output signals of the differential output clock signals (clk_p and clk_n) and provides the duty-cycle continuous control signal to the main DCC 200 that allows the main DCC 200 to adjust the duty cycle of the clock-in signal (e.g., the single-ended clock signal) by a certain amount (e.g., by a certain percentage, a certain amount of time, etc.) and output the duty-cycle adjusted single-ended clock signal. The duty-cycle continuous control signal from duty cycle detector 112 can have specific voltages, currents, that allow for the main DCC 200 to apply the desired amount of duty-cycle adjustment. The duty cycle continuous control signal is continuously provided to the main DCC 200 based on the constantly monitored duty cycles of the first and second output signals of the differential output clock signals (clk_p and clk_n). The duty cycle detector 112 also generates the duty-cycle trim control signal based on the duty cycles detected from the first and second output signals of the differential output clock signals (clk_p and clk_n). As discussed above, in one embodiment the duty-cycle trim control signal can be sent to the trim DCC 202 only once (during the calibration phase) to calibrate the amount of error correction that is applied by the trim DCC 202, and after calibration the duty-cycle trim control signal (or a value or values associated therewith) can be stored in memory and reused without further regeneration thereof.

Accordingly, the duty cycle of the single-ended clock clock-in (clk_in) signal is adjusted by the main DCC 200 before the clock-in (clk_in) signal is received by the S2d single-ended to differential converter 104. Then, a second duty-cycle correction is performed by the trim DCC 202 to correct the errors introduced by the single-ended to differential conversion or Monte Carlo variations. As discussed above, the trim DCC 202 corrects common mode duty cycle error, which means it changes the duty cycle of both signals included in the differential clock signal in the same direction, such that the duty cycle of both the first and second signals included in the differential clock signal is either increased or decreased by the trim DCC 202. These errors can be shown to be relatively small and mostly dependent on process variations. The error variation over the supply voltage and/or temperature ranges is negligible as well as the time variation over clock frequency changes. Therefore, the duty-cycle correction performed by the trim DCC 202 is simple and compact and only needs to be calibrated once at start-up.

In more detail, an aspect of the present disclosure performs the two-step duty-cycle correction as follows. In one step the main DCC 200 adjusts the duty-cycle of the clock-in (clk_in) signal (e.g., a single-ended clock signal) by monitoring first and second output signals of the differential output clock signals (clk_p and clk_n) such that the duty-cycle adjusted single-ended clock signal and the first and second signals of the differential clock signals output from the s2d 104 have equal duty-cycles. At this step the output duty-cycle may be near 50%, but there can be some residual error. This residual error is generally the same on both clock phases, (e.g., 47% on clk_p and 47% on clk_n).

In second step, the trim DCC 202 is calibrated (or has been previously calibrated) to add an equal time correction to both the first and second signals of the differential clock signal in order to generate exactly (or as near as possible to) 50% duty cycle for both the first and second signals of the error corrected differential clock signals output from the trim DCC 202. For example, the trim DCC 202 can add a 3% duty cycle correction to both clk_p and clk_n signals to correct duty from 47% to 50% on both clk_p and clk_n signals. This amount of correction can be stored by the trim DCC 202 and constantly applied thereafter by the trim DCC 202. During operation the duty-cycle correction loop keeps working to correct for temperature and supply voltage drifts over time, but using only the main DCC 200 with updates in the duty-cycle continuous control signal, without necessarily continuously updating the trim DCC 202 after the calibration. The operations described herein with reference to FIG. 2 can be carried out on other types of signals, not just clock signals, that need duty cycle correction.

A benefit of using this two-step duty-cycle corrector is that the complexity of clock duty-cycle correction for high-speed SERDES communication systems can be reduced. This reduction of complexity results in reduced area and power consumption to about half when compared to other duty-cycle correctors. This benefit is achieved using the two-step correction, where the main adjustment is done on the single-ended clock-in (clk_in) signal instead of on the differential signal, wherein only the main DCC 200 is continually adjusted and the trim DCC 202 is only calibrated once.

Figure 3:
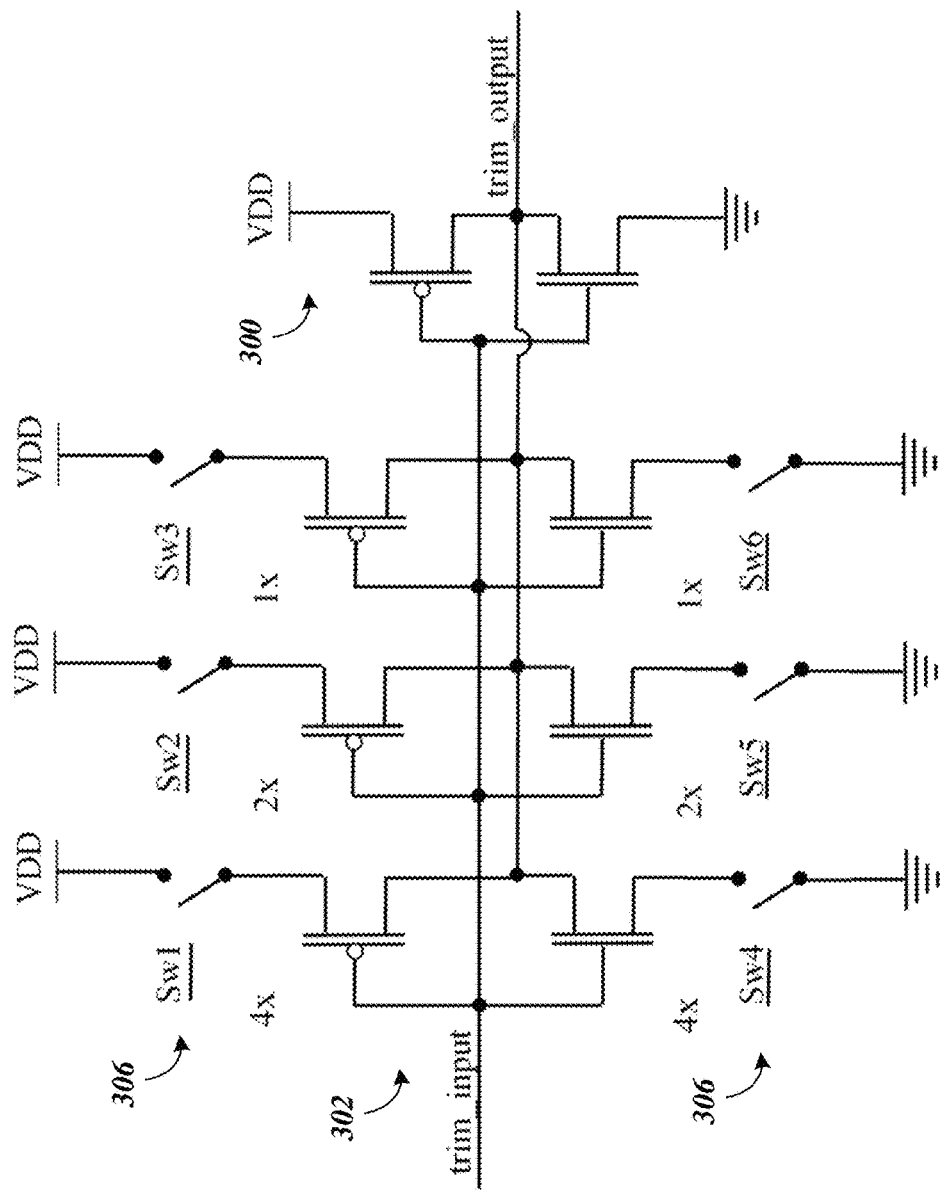
FIG. 3 illustrates example components of trim DCC.

FIG. 3 illustrates an embodiment for example components that can be included in the Trim DCC 202 discussed above with reference to FIG. 2. FIG. 3 illustrates only one trim_input and one trim_output. However, the Trim DCC can similarly have two inputs and two outputs to generate the first and second signals of the error-corrected differential signal from the first and second differential signals.

FIG. 3 includes an inverter logic gate 306 that receives the trim input control signal and provides the trim output signal. The circuit further includes an additional three logic gates 302 that can be independently connected in the path of the trim input signal prior to the logic gate 300 by switches Sw1-Sw6. As illustrated, by connected one switch in the path a delay is created of 1×, 2× and 3× depending upon how many logic gates are included in the trim input signal path by switches Sw1-Sw6. When used for trim control in the DCCs 106 and 108 of FIG. 1, the trim_input and trim_output in FIG. 3 form the differential clock signal inputs and outputs to the circuit, and the duty cycle continuous control signal is applied to control switches 306. The DCCs 106 and 108 can similarly form the Trim DCC 202 in FIG. 2 and include the circuitry of FIG. 3 connected as described.

Figure 4:
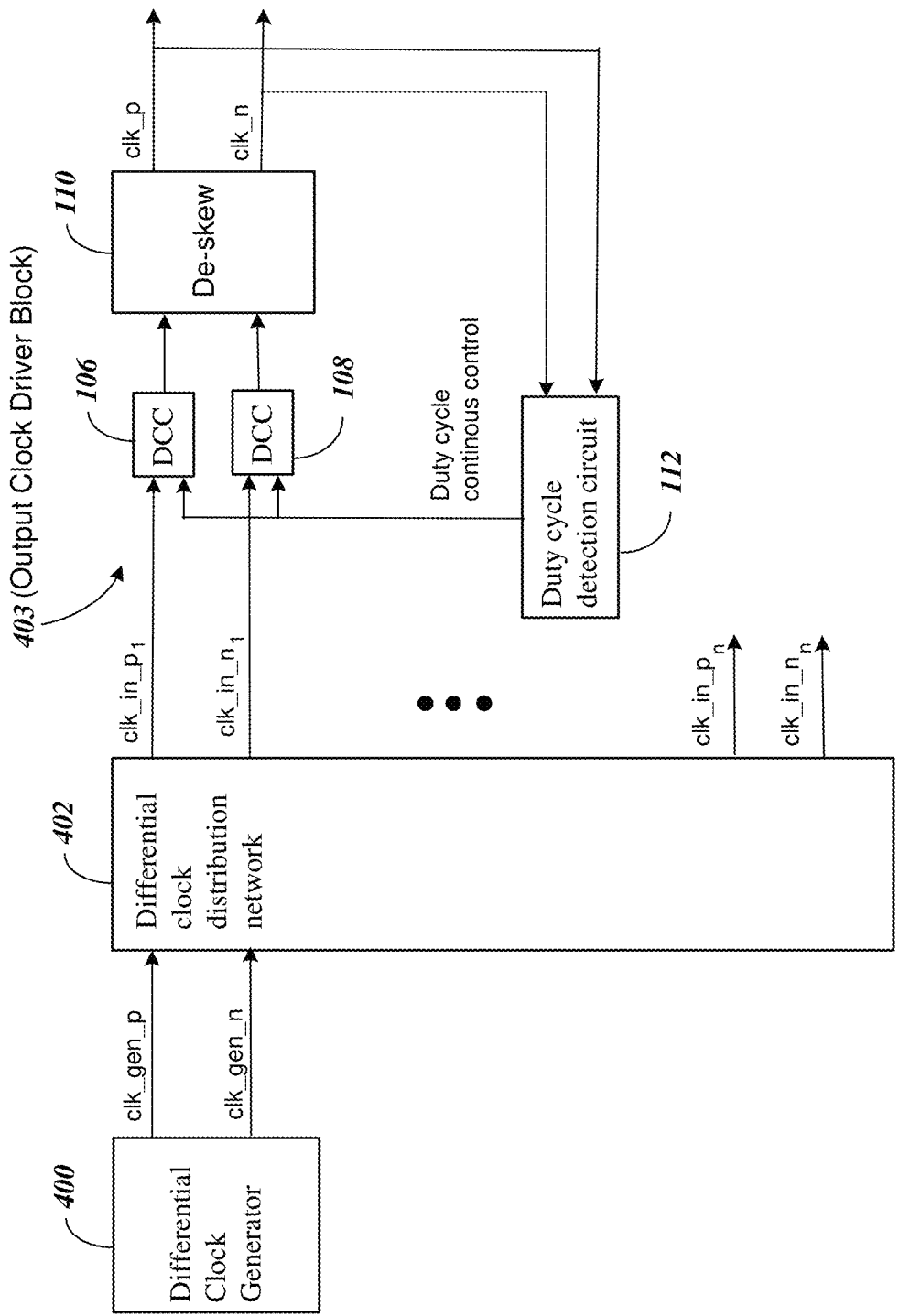
FIG. 4 illustrates components that perform the duty-cycle correction using a fully differential clock distribution with two DCC loops, one for each clock phase.

FIG. 4 illustrates alternative embodiments of the present disclosure that performs duty-cycle correction wherein the clock circuit is a fully distributed differential clock instead of a single-ended clock signal that is later converted to a differential clock. The system shown in FIG. 4 performs duty-cycle correction in output clock driver block 403 using a fully differential clock distribution with two DCC loops, one for each clock phase. The system of FIG. 4 includes components carried over from FIG. 1 which are similarly labeled.

FIG. 4 first includes a differential clock generator 400 instead of a single ended clock generator 100 used in the previous systems of FIGS. 1-2. The differential clock generator 400 provides two separate differential signals, a first positive clk_gen_p and a second negative clk_gen_n signal. These differential signals are provided in FIG. 4 through a differential clock distribution network 402 instead of the single ended clock distribution networks 102 of FIGS. 1-2. The differential outputs clk_in_p$_{1-n}$, and clk_in_n$_{1-n}$, are provided to output clock driver blocks, with output clock driver block 403 shown in FIG. 4. The output clock driver block 403 provides for clock duty cycle correction with similar components and function to those shown in output clock driver block 103 of FIG. 1 except for S2D converter 104 used in FIG. 1 to convert single ended clock signals to differential clock signals is not needed in the output clock driver block 403 of FIG. 4 because the differential clock signals are directly provided.

Figure 5:
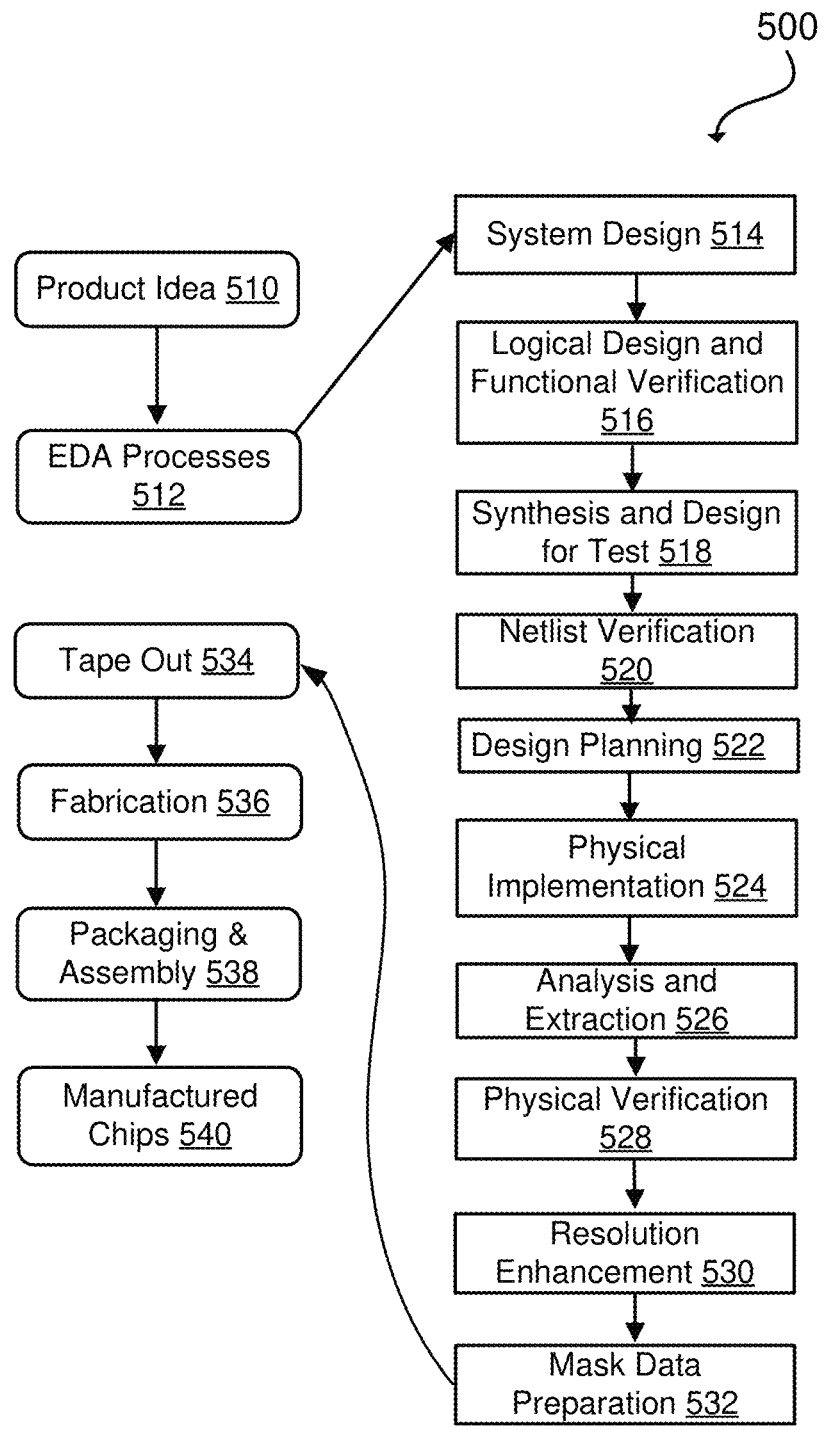
FIG. 5 depicts a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 5. The processes described by be enabled by EDA products (or EDA systems).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
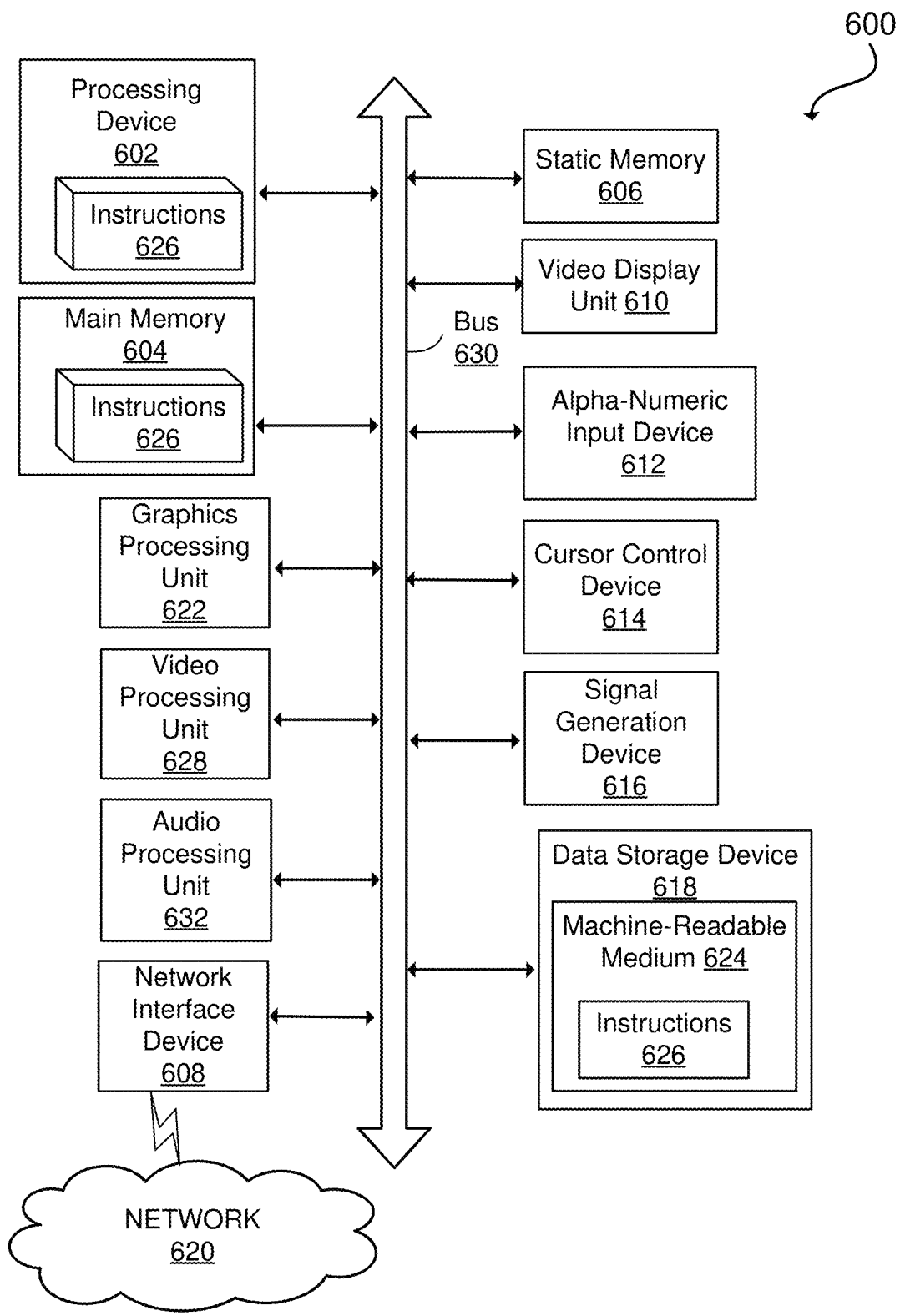
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of performing duty-cycle correction on a clock signal, the method comprising:
performing a first duty cycle correction (DCC) of a single-ended clock signal, to generate a duty cycle adjusted single-ended clock signal, wherein a duty cycle of the single-ended clock signal is corrected according to a received duty-cycle continuous control signal;
converting the duty cycle adjusted single-ended clock signal to differential clock signals; and
performing a second DCC by correcting a duty cycle of the differential clock signals according to a duty-cycle second control signal received and generated in dependence upon duty cycles detected from differential output clock signals to provide error-corrected differential clock signals.

2. The method of claim 1, wherein the duty-cycle continuous control signal is generated in dependence upon the duty cycles detected from the differential output clock signals.

3. The method of claim 1, wherein, after the performing of the second DCC, de-skewing is performed on the error-corrected differential clock signals to remove skew between the error-corrected differential clock signals.

4. The method of claim 1, wherein the second DCC adds a phase shift to the duty cycles of the differential clock signals in order to calibrate the duty cycle of the differential output clock signals to substantially 50% plus or minus 1%.

5. The method of claim 1, wherein the performing of the second DCC corrects the differential clock signals by applying a same fixed amount of common duty-cycle correction to both the differential clock signals.

6. The method of claim 1,
wherein an amount of first duty-cycle correction applied to the single-ended clock signal is determined in a calibration process, and
wherein a fixed amount of common duty-cycle correction applied to both the differential clock signals is determined in a calibration process.

7. The method of claim 6, wherein the differential output clock signals are to be used as a system clock and wherein, during the calibration process, the method further includes:
detecting duty cycles of the differential output clock signals;
determining the fixed amount of common duty-cycle correction to be applied to the differential clock signals in dependence upon the detected duty cycles of the differential output clock signals; and
generating the duty-cycle second control signal according to the determined fixed amount.

8. The method of claim 7, wherein the differential output clock signals have approximately a 50% duty cycle.

9. The method of claim 6, wherein, during the calibration process, the method further includes:
determining an amount of duty-cycle adjustment to be continuously applied to the single-ended clock signal in dependence upon detected duty cycles of the differential output clock signals;
generating the duty-cycle continuous control signal in dependence upon the determined amount of duty-cycle adjustment to be continuously applied to the single-ended clock signal;
determining an amount of duty cycle second control signal adjustment to be applied to the differential clock signals in dependence upon detected duty cycles of the differential output clock signals during the calibration; and
generating the duty cycle second control signal in dependence upon the determined amount of duty-cycle second adjustment during the calibration to be applied as a fixed amount while the continuously applied amount of duty-cycle adjustment applied to the single-ended clock signal is varied.

10. The method of claim 9, wherein the differential clock signals have a substantially equal duty cycle.

11. The method of claim 10, wherein one of the differential clock signals is a positive signal and another of the differential clock signals is a negative signal.

12. The method of claim 1, wherein one of the differential clock output signals is a positive signal and another of the differential clock signals is a negative signal.

13. The method of claim 1,
wherein the second DCC is stored in memory, the method further comprising:
applying further duty cycle corrections during a correction loop, wherein the further DCCs apply the second DCC stored in memory instead of using the duty-cycle second control signal to set the second DCC.

14. A system comprising:
a signal generator providing an input signal;
a main duty cycle corrector configured to perform a main duty cycle correction (DCC) of the input signal to generate a duty cycle adjusted signal, wherein a duty cycle of the input signal is corrected according to a received duty-cycle continuous control signal;
a converter configured to convert the duty cycle adjusted signal to differential signals; and
a trim duty cycle corrector configured to perform a trim DCC by correcting a duty cycle of the differential signals according to a duty-cycle trim control signal received from and generated by a duty cycle detector in dependence upon duty cycles detected from differential output signals to provide error-corrected differential signals.

15. The system of claim 14, wherein the duty-cycle continuous control signal is generated in dependence upon the duty cycles detected from the differential output signals.

16. The system of claim 14 further comprising:
a de-skewing device configured to receive the error-corrected differential signals and to de-skew the error-corrected differential signals to remove skew between the error-corrected differential signals.

17. The system of claim 14, wherein the input signal is a single-ended clock signal, the duty cycle adjusted signal is a duty cycle adjusted clock signal, the differential signals are differential clock signals, and the differential output signals are differential output clock signals.

18. The system of claim 17, further comprising:
a distribution network for receiving an output from the signal generator, the distribution network including clock lanes distributed from a clock signal source,
wherein one of the clock lanes of the distribution network provides the single-ended clock signal provided by the signal generator to the main duty cycle corrector.

19. The system of claim 18, further comprising:
output clock driver blocks, each output clock driver block provided at an end of one of the clock lanes, wherein each of the output clock driver blocks includes:
the main duty cycle corrector;
the converter;
the trim duty cycle corrector; and
the duty cycle detector.

20. A non-transitory computer readable medium comprising stored instructions, which when executed by a processor, cause the processor to:
- perform a main duty cycle correction (DCC) of a single-ended clock signal, to generate a duty cycle adjusted single-ended clock signal, wherein a duty cycle of the single-ended clock signal is corrected according to a received duty-cycle continuous control signal;
- convert the duty cycle adjusted single-ended clock signal to differential clock signals; and
- perform a trim DCC by correcting a duty cycle of the differential clock signals according to a duty-cycle trim control signal received and generated in dependence upon duty cycles detected from differential output clock signals to provide error-corrected differential clock signals.

* * * * *